United States Patent
Potera et al.

(10) Patent No.: US 10,950,695 B1
(45) Date of Patent: Mar. 16, 2021

(54) SILICON CARBIDE PLANAR MOSFET WITH WAVE-SHAPED CHANNEL REGIONS

(71) Applicant: Global Power Technologies Group, Inc., Lake Forest, CA (US)

(72) Inventors: Rahul R. Potera, Irvine, CA (US); Vipindas Pala, San Jose, CA (US); Tony Witt, Lake Forest, CA (US)

(73) Assignee: SEMIQ INCORPORATED, Lake Forest, CA (US)

( * ) Notice: Subject to any disclaimer, the term of this patent is extended or adjusted under 35 U.S.C. 154(b) by 0 days.

(21) Appl. No.: 16/675,161

(22) Filed: Nov. 5, 2019

(51) Int. Cl.
*H01L 29/16* (2006.01)
*H01L 29/10* (2006.01)
*H01L 29/78* (2006.01)

(52) U.S. Cl.
CPC ...... *H01L 29/1033* (2013.01); *H01L 29/1608* (2013.01); *H01L 29/7832* (2013.01)

(58) Field of Classification Search
CPC combination set(s) only.
See application file for complete search history.

(56) References Cited

U.S. PATENT DOCUMENTS

| | | | |
|---|---|---|---|
| 5,008,725 A | 4/1991 | Lidow et al. | |
| 7,498,633 B2 | 3/2009 | Cooper et al. | |
| 9,997,599 B2 | 6/2018 | Cooper | |
| 2015/0028350 A1* | 1/2015 | Suvorov | H01L 21/047 257/77 |

* cited by examiner

Primary Examiner — Moin M Rahman
(74) Attorney, Agent, or Firm — The Law Offices of Bradley J. Bereznak

(57) ABSTRACT

A silicon carbide MOSFET includes first and second source regions respectively disposed in the first and second well regions. Each of the first and second source regions extends up to a top surface of the substrate. First and second channel regions of the respective first and second well regions laterally separate the first and second source regions from a JFET region by a channel length. The first and second channel regions extend up to the top surface. The first and second channel regions are each arranged in a wave-shaped pattern at the top surface of the substrate. The wave-shaped pattern extends in first and second lateral directions. In an on-state, current flows laterally from the first and second source regions to the JFET region, and then in a vertical direction down through an extended drain region to the drain region.

20 Claims, 5 Drawing Sheets

SILICON CARBIDE PLANAR MOSFET WITH WAVE-SHAPED CHANNEL REGIONS

TECHNICAL FIELD

The present disclosure relates to silicon carbide power semiconductor devices. More specifically, the present invention relates to planar silicon carbide metal-oxide semiconductor field-effect transistor (MOSFET) device structures and layouts capable of withstanding high voltages.

BACKGROUND

High-voltage, field-effect transistors, also known as power transistors or power semiconductor devices, are well known in the semiconductor arts. Most often, a high-voltage power transistor comprises a vertical transistor device structure that includes an extended drain or drift region that supports the applied high-voltage when the device is in the "off" state. Power transistors of this type are commonly used in power conversion applications such as AC/DC converters for offline power supplies, motor controls, and so on. These power transistor devices can be switched at high voltages and achieve a high blocking voltage in the "off" state while minimizing the resistance to current flow between the drain and source, often referred to as the specific on-resistance ($R_{on}$), in the "on" state.

Power MOSFETs are commonly based on silicon and other wide bandgap semiconductor materials, such as silicon carbide. Silicon carbide (SiC) MOSFETs are advantageously utilized in certain electronic devices due to their superior physical properties over silicon-based devices of the same device area. For example, SiC MOSFETs are known to exhibit higher blocking voltage, lower $R_{on}$, and higher thermal conductivity as compared to silicon MOSFETs. A double-implanted metal-oxide semiconductor field-effect transistor (DMOSFET) may be formed in a SiC substrate.

Many power MOSFETs employ a device structure that includes an extended drain region that supports or blocks the applied high-voltage (e.g., hundreds of volts or more) when the device is in the "off" state. In a conventional vertical power MOSFET device structure, an epitaxial layer of semiconductor material forms an extended drain or drift region for current flow in the on-state. A gate structure is typically formed near the top of the substrate. Application of an appropriate voltage potential to the gate causes a conductive channel to be formed in a body region such that current may flow through the channel and then vertically downward through semiconductor material, i.e., from a top surface of the substrate where the source region is disposed, down to the bottom of the substrate where the drain region is located.

The specific on-resistance ($R_{on}$) in a vertical power MOSFET is a combination of the channel resistance, JFET resistance, drift region resistance and substrate resistance. The channel resistance is a function of semiconductor material, channel width, channel length, operating conditions (e.g., drain current and voltage), carrier mobility and cell pitch. For optimal performance in the on-state, it is desirable to minimize $R_{on}$. In a SiC power transistor device channel resistance is relatively high and carrier mobility is relatively low. However, drift region resistance is a direct function of blocking voltage. Consequently, channel resistance dominates $R_{on}$ at voltages less than about 1200 volts. Past approaches to reducing the on-resistance of SiC power MOSFETs have typically required complicated processing steps including trenches, new technologies, or trade-offs with respect to other device performance parameters, e.g., breakdown voltage. Additionally, attempts to lower $R_{on}$ by reducing the length of the channel region have been largely unsuccessful as it adds leakage that lowers the blocking voltage of the device.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
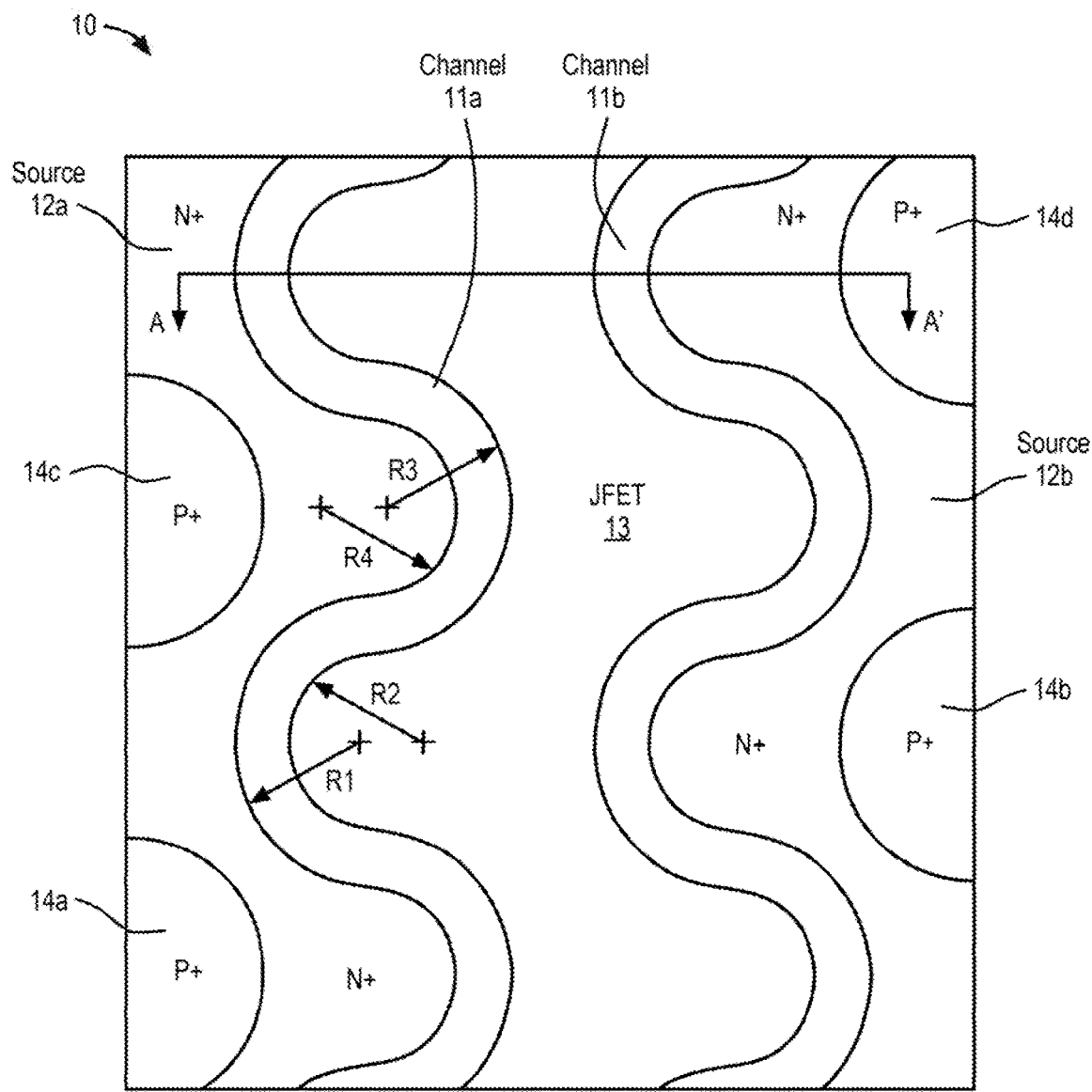
FIG. 1 is a top level view of an example layout for a SiC MOSFET device structure with serpentine or wave-shaped channel regions.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the disclosed subject matter. Also, common but well-understood elements that are useful or necessary in a commercially feasible embodiment are often not depicted in order to facilitate a less obstructed view of these various embodiments presented.

DETAILED DESCRIPTION

In the following description numerous specific details are set forth in order to provide a thorough understanding of the disclosed subject matter. It will be apparent, however, to one having ordinary skill in the art that the specific details need not be employed to practice the various embodiments described. In other instances, well-known systems, devices, or methods have not been described in detail in order to avoid obscuring the disclosed subject matter.

Reference throughout this specification to "one embodiment", "an embodiment", "one example" or "an example" means that a particular feature, structure or characteristic described in connection with the embodiment or example is included in at least one embodiment of the disclosed subject matter. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or sub-combinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

As used herein, a "wafer" is a thin slice of crystalline material, such as silicon carbide, used in the fabrication of semiconductor devices and integrated circuits. The term "substrate" refers to the semiconductor supporting material upon which or within which the elements of a semiconductor device are fabricated, which substantially comprises the thickness of a wafer. Upon completion of the fabrication process the wafer is typically scribed and broken into individual semiconductor die, each of which consists of one or more semiconductor devices.

In the context of the present application, when a transistor is in an "off state" or "of" the transistor does not substantially conduct current. Conversely, when a transistor is in an "on state" or "on" the transistor is able to substantially conduct current. By way of example, a power transistor may comprise an N-channel MOSFET with a SiC substrate and SiC epitaxial layer which, in the off-state, supports a high blocking voltage between the first terminal, a drain, and the second terminal, a source. The power MOSFET may comprise a power switch that is driven by an integrated controller circuit to regulate energy provided to a load.

A SiC planar MOSFET device structure having a layout with serpentine or wave-shaped regions is described. The planar MOSFET device structure layout provides a lower specific on-state resistance as compared to prior art approaches, while supporting very high voltages in the off-state. In other embodiments the device structure layout is modified to reduce lateral transistor cell pitch, which further helps lower $R_{on}$.

FIG. 1 is a top level view of an example planar layout for a single SiC MOSFET 10 with channel regions 11 arranged in a serpentine or wave-shaped layout pattern. It is appreciated that the portion of the layout shown may represent a single transistor cell. The transistor cell shown may be replicated in a mirrored or translated fashion many times in both the X and Y lateral directions across a wafer to form a completely fabricated MOSFET device. Thus, there may be repetitions of the wave-shaped regions across the semiconductor die. The MOSFET 10 of FIG. 1 includes highly-doped N+ source regions 12a & 12b that adjoin the outer sidewalls or boundaries of respective low-doped P-type channel regions 11a & 11b. A centrally-located N+ JFET region 13 adjoins the inner sidewalls of channel regions 11a & 11b.

Each of the channel regions 11 in the example of FIG. 1 is formed as a serpentine or wave-shaped pattern of semi-circular regions that extend in the lateral X and Y directions, with the semi-circular regions alternating orientation by 180 degrees in a wave-like manner along the lateral Y-direction. The channel length, as measured at any tangential point along the sides of channel regions 11 is a constant length. In one embodiment the channel length is about 0.6 µm. In other words, the radius of the inner and outer semi-circular sides that define the wave-shape of channels 11 are determined to be an identical distance so that the channel length separating source 12 from JFET region 13 is constant length. By way of example, adjacent semi-circular portions of channel 11a are shown in FIG. 1 having radiuses $R_1=R_2=R_3=R_4$.

Practitioners in the art will appreciate that the wave-shaped channel regions 11a & 11b are shown in FIG. 1 as being in-phase. That is, each channel region 11 "crests" toward the right-hand side of the cell in the X-direction at the same points in the Y-direction. Similarly, each channel region 11 "crests" toward the left-hand side of the cell in the X-direction at the same points in the Y-direction.

Also shown in the layout of SiC MOSFET 10 are a plurality of circular-shaped, highly-doped P+ body regions 14 that adjoin source regions 12. For instance, P+ body regions 14a & 14c are shown laterally adjoining source region 12a. Likewise, P+ body regions 14b & 14d are shown laterally adjoining source region 12b. Note that P+ body regions 14a & 14c are located in pocket areas to the left of channel region 11a, and P+ body regions 14b & 14d are located in pocket areas to the right of channel region 11b.

In addition, the locations of P+ body regions 14b & 14d in the Y-direction are 180 degrees out-of-phase with respect to the position in the Y-direction of P+ body regions 14a & 14c. P+ body regions 14a & 14c are respectively located under the semi-circular portions (pockets) of channel region 11a that are shown cresting toward the right-hand side of the cell, whereas P+ body regions 14b & 14d are respectively located under the semi-circular portions (pockets) of channel region 11b that are shown cresting toward the left-hand side of the transistor cell. In one embodiment, the radius of each P+ body region 14 is about 1.1 µm.

It should be understood that in other embodiments there need not be a P+ body region disposed under each cresting portion of the wave-shaped channel regions. In other words, other embodiments may have fewer P+ body regions than what is shown in FIG. 1, with the P+ body regions being farther spaced-apart in the Y-direction. Reducing the number of P+ body regions may decrease source resistance versus body contact resistance. Furthermore, in still other embodiments, the shape of the P+ body regions need not be circular in shape; instead, they may be formed as other curved or rectilinear shapes.

Practitioners in the art will appreciate that locating the P+ body regions in the pocket areas of the wave-shaped channel regions helps to reduce cell pitch in the lateral X direction, which reduces $R_{on}$. In addition, the width of the channel in the Y direction is increased due to the wave-shaped layout, which substantially reduces the channel resistance, thereby further reducing $R_{on}$. Because the channel length is the same along all points of the wave-shaped channel region the likelihood of leakage due to short channel effect is also reduced.

Figure 2:
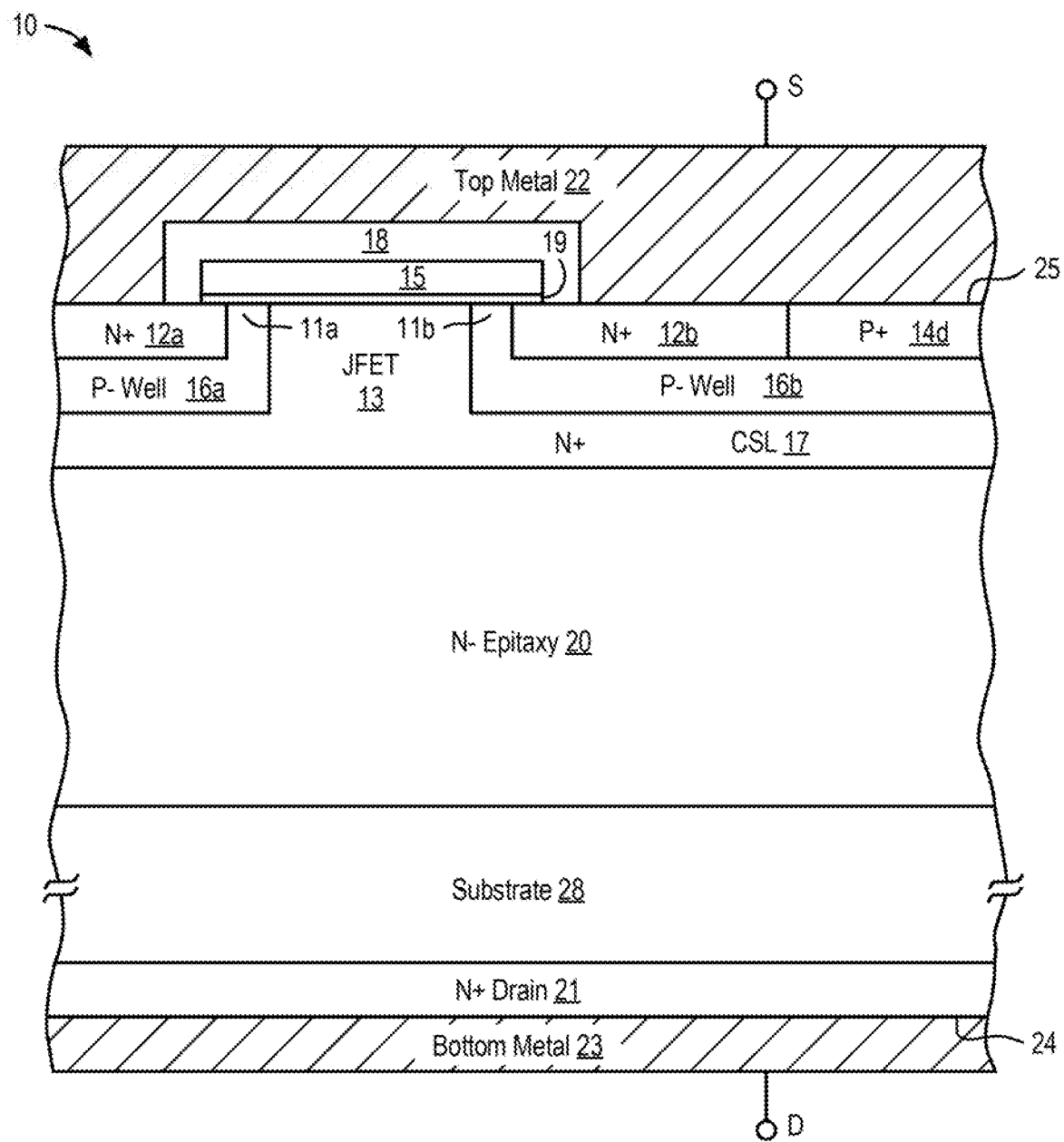
FIG. 2 is an example cross-sectional side view of the SiC MOSFET device layout shown in FIG. 1, as taken along cut lines A-A'.

FIG. 2 is an example cross-sectional side view of the SiC MOSFET device layout shown in FIG. 1, taken along cut lines A-A'. SiC MOSFET 10 is a vertical transistor structure with a highly-doped N+ drain region 21 disposed on a planar surface 24 of the bottom SiC substrate 28. A bottom metal layer 23 forms a drain terminal that provides electrical (ohmic) contact with N+ drain region 21. A lightly-doped N-epitaxial layer 20 is disposed above N+ drain 21 and bottom substrate 28. Epitaxial layer 20 forms an extended drain or drift region of SiC MOSFET 10. Epitaxial layer 20 may be formed by a Chemical Vapor Deposition (CVD) process.

A highly-doped N+ current spreading layer (CSL) 17 is shown disposed above N− epitaxy layer 20. A portion of N+ CSL 17 is shown extending up to a top planar surface 25 of the substrate. The portion that extends up to top surface 25 forms the JFET region 13 of SiC MOSFET 10. JFET region 13 is bounded laterally by low-doped P− well regions 16a & 16b. Extending to top surface 25 and disposed within P− well regions 16a & 16b are respective N+ source regions 12 & 12b. A P+ body region 14d is also shown disposed in P− well 16b at top surface 25 adjoining N+ source region 12b.

The channel regions 11a & 11b are defined in the substrate where the respective P− wells 16a & 16b extend up to top planar surface 25. The length of each channel region 11 is measured by the lateral distance between the source region 12 and JFET region 13.

By way of example, for a 1200 V MOSFET device N– epitaxial layer 20 may have a doping concentration of about 9E15/cm3 and a thickness of about 10 μm. Bottom SiC substrate 28 may have a doping concentration of about 4E18/cm3 with the thickness being in a range of 100 μm to 360 μm. P– wells 16 are about 1 μm deep beneath top surface 25 and have a retrograde doping profile of about 2E18/cm3 near the junction with N– epitaxial layer 20 lowering to about 1E17/cm3 in the channel region 11 near top surface 25. N+ source regions 12 and P+ body regions 14 are both shallow and doped to a concentration of about 1E19/cm3. JFET region 13 typically has a doping that is higher than N– epitaxial layer 20, but much lower than N+ source regions 12.

Continuing with the example of FIG. 2, a gate member 15 is shown disposed above channel regions 11a & 11b, JFET region 13, and a small portion of N+ source regions 12a & 12b. In one embodiment, gate member 15 comprises polysilicon. A thin gate dielectric (e.g., oxide) separates gate member 15 from top surface 25 of the semiconductor substrate. An interlayer dielectric (ILD) 18 covers the top and sides of gate member 15, fully insulating gate member 15 from top metal layer 22. Top metal layer 22 comprises a source terminal that electrically contacts source regions 12a & 12b and P+ body region 14d.

In the top view of FIG. 1, gate member 15 is not shown for clarity reasons. However, persons of skill in the art would understand that gate member 15 may extend from slightly past the left-side of channel region 11a to slightly past the right-side of channel region 11b. Gate member 15 follows the same serpentine pattern along the far sides of channel regions 11a & 11b.

When a sufficiently high voltage is applied to gate member 15 relative to source region 12, a conduction channel forms just beneath top planar surface 25 in each channel region 11. Thus, in the on-state current flows in MOSFET 10 horizontally from source regions 12 to JFET region 13, and then vertically down through CSL 17 and N– epitaxy layer (extended drain region) 20 to N+ drain region 21.

It is appreciated that in one embodiment MOSFET 10 may be fabricated as a double-implanted metal-oxide, semiconductor field-effect transistor (DMOSFET).

Figure 3:
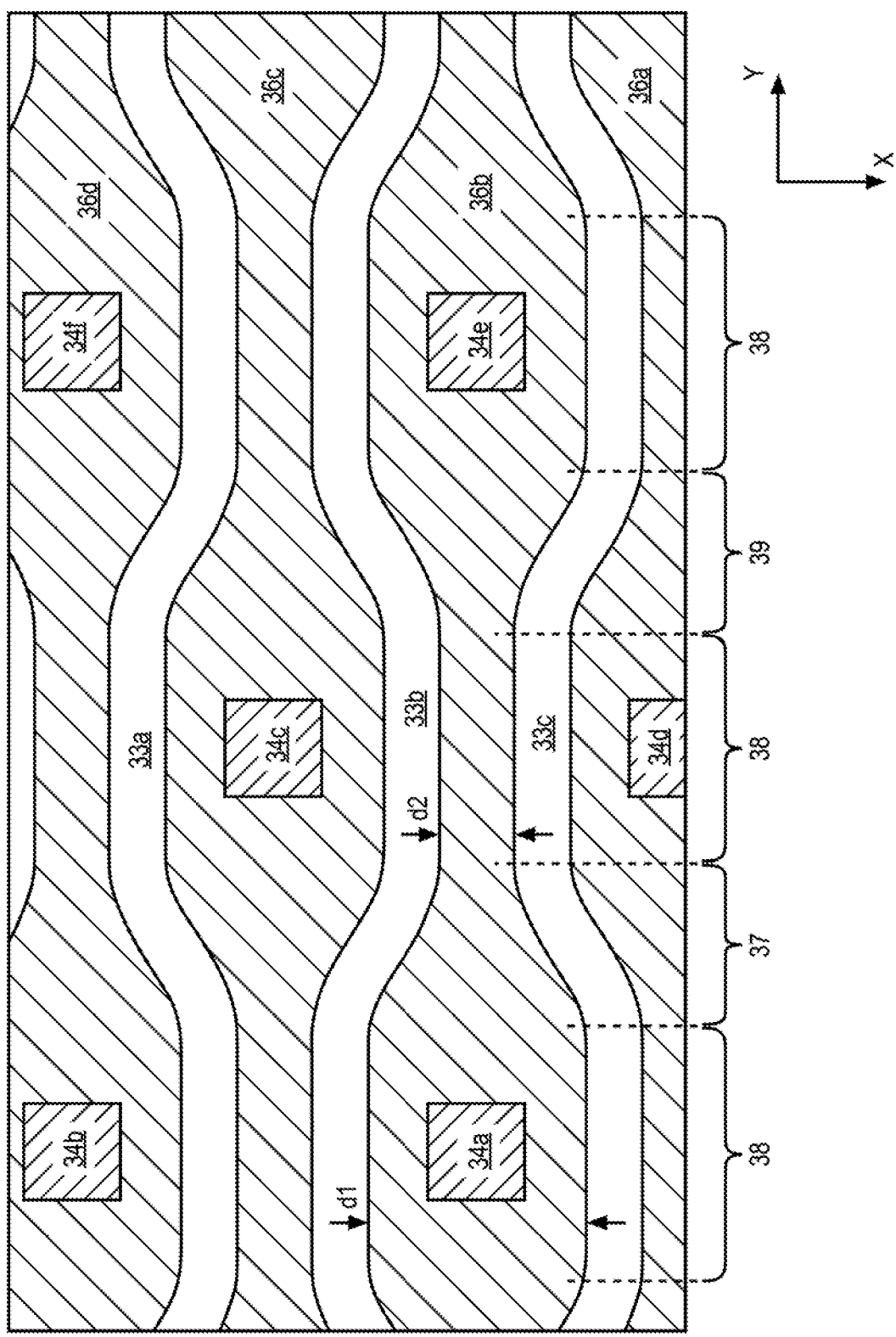
FIG. 3 is a top level view of another example layout for a SiC MOSFET device structure with serpentine or wave-shaped regions.

FIG. 3 is a top level view of another example layout for a SiC MOSFET device structure with regions having a serpentine or wave-shaped pattern, where the curved waveshape is interrupted by straight sections. The layout of FIG. 3 shows JFET regions 33a-33c having a serpentine shape with straight sections 38 that are alternately connected by curved sections 37 & 39. It is appreciated that sections 37 & 39 are identically-shaped but mirrored with respect to one another. As shown, ascending section 37 shifts the serpentine layout up in the X direction and descending section 39 shifts it down in the X direction. Note that the straight sections 38 are all aligned with each other in the X direction with adjacent serpentine-shaped JFET regions being 180 degrees out-of-phase. This layout causes the straight sections of adjacent JFET regions 33b and 33c to be alternately separated by a wide distance $d_1$ and a narrow distance $d_2$ measured in the X direction.

Adjacent JFET regions 33 are shown being separated in the X direction by P– well regions 36. For example, JFET region 33a is separated from JFET region 33b by P– well region 36c, and JFET region 33b is separated from JFET region 33c by P– well region 36b. A square-shaped P+ body region (contact) 34 is shown centrally-disposed in each area where adjacent straight sections 38 are separated by wide distance $d_1$. For instance, P+ body regions 34a & 34e are shown centrally-disposed in the areas of P– well region 36b between the straight sections 38 of adjacent JFET regions 33b & 33c that are separated by distance $d_1$. Similarly, P+ body region 34c is shown centrally-disposed in the area of P– well 36c between the straight sections 38 of adjacent JFET regions 33a & 33b that are separated by distance $d_1$.

It is appreciated that in other embodiments, not every area of P– well region 36 between the straight sections 38 of adjacent JFET regions 33 may include a P+ body region 34.

Note that the source regions are not shown in the top view of FIG. 3 for clarity reasons. Persons of skill in the art will understand that the source regions adjoin P+ regions 34 covering the P– well regions except for the narrow channel regions disposed on opposite sides of the JFET regions. The channel regions follow the serpentine shape of each of the JFET regions. It is appreciated that an N+ source implant may be utilized to form the N+ source regions that define the channel regions (see FIG. 1). The p-type channel regions are the part of the P– well regions 36 that are not implanted with the N+ source impurity.

It is appreciated that in different embodiments the length of the straight sections in the Y direction, as well as the length and shape of the curved sections, may vary. Practitioners in the art will understand that longer straight sections reduce source contact resistance, whereas shorter straight sections increase the wave nature of the channel, thus reducing channel resistance. Similarly, the shape of the P+ body regions may vary, e.g., oval, circular, rectangular, etc. In still other embodiments, the SiC MOSFET may include a combination of short and long straight sections, with the short sections being aligned with each other, and the long sections being aligned with each other, in the X direction.

Figure 4:
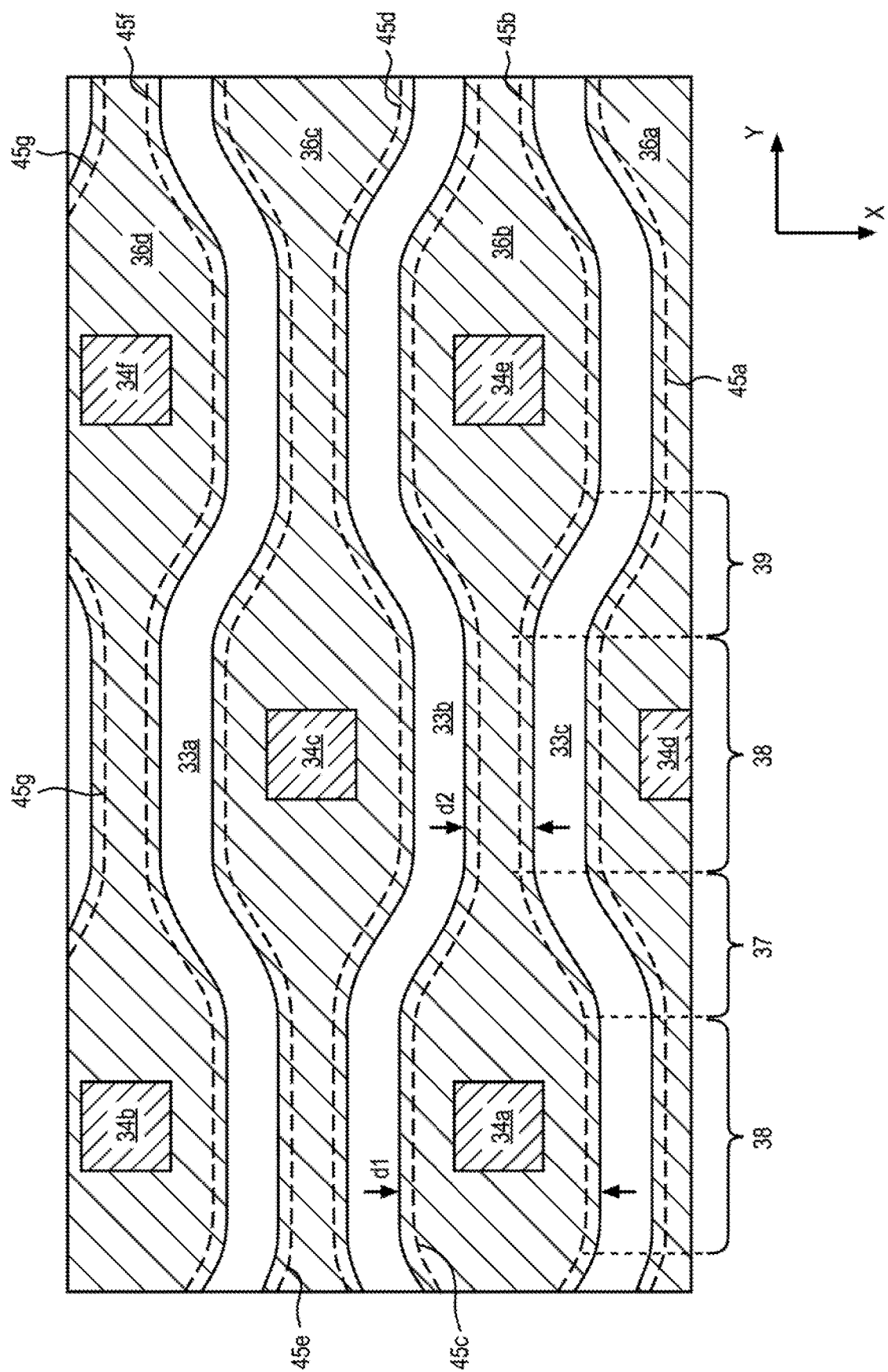
FIG. 4 is a top level view of the example layout of FIG. 3 additionally showing the location of gate members.

FIG. 4 is a top level view of the example layout of FIG. 3 additionally showing the location of gate members 45. For example, dashed lines 45a & 45b define the lateral sides of a gate member that extends over JFET region 33c, the adjoining channel regions, and a portion of the N+ source that adjoins the channel regions. Likewise, dashed lines 45c & 45d define the lateral sides of a gate member that extends over JFET region 33b, and dashed lines 45e & 45f define the lateral sides of a gate member that extends over JFET region 33a.

Figure 5:
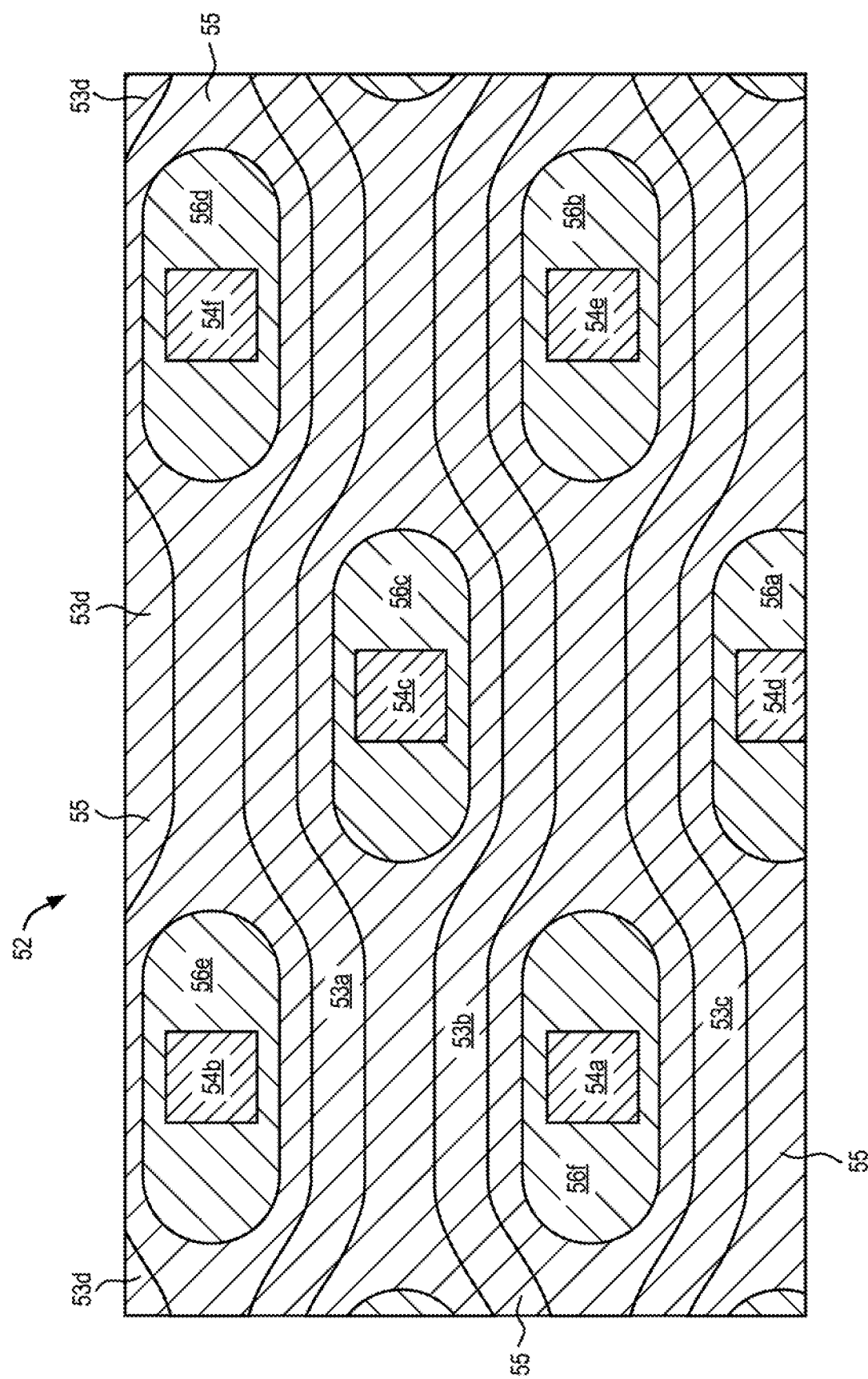
FIG. 5 is a top level view of another example layout for a SiC MOSFET device structure with a single merged gate member.

FIG. 5 is a top level view of another example layout for a SiC MOSFET device 52 with a single gate member 55. In this example layout the pitch in the X direction is substantially reduced, as compared with a conventional MOSFET (no wavy layout), such that adjacent wave-shaped JFET regions 53 are located close enough that the individual gate members (shown in FIG. 4) merge together to form a single gate member 55. Gate member 55 is shown covering the entire layout except for oval or racetrack-shaped open areas 56 where a P+ body region 54 is centrally-located. For example, gate member 55 covers JFET regions 53a & 53b and the area in between, except for the racetrack-shaped opening 56c that includes P+ body region 54c. Similarly, gate member 55 covers JFET regions 53b & 53c and the area in between, except for the racetrack-shaped areas 56b & 56f that respectively include P+ body regions 54e & 54a.

Note that the N+ source regions and the P– well regions are not shown in the layout of FIG. 5 for clarity reasons. Persons of skill in the art will understand that the P– well regions extend in the area between adjacent JFET regions 53. The N+ source regions cover the P– well regions except for the area adjacent the sides of JFET regions 53 where the channel regions are disposed. It should also be understood that the top metal layer that forms the source terminal of MOSFET 52 electrically contacts the N+ source regions and P+ body regions 54 only within the open areas 56. Gate member 55 is completely insulated from the top metal layer by an interlayer dielectric material (e.g., ILD 18 in FIG. 2).

Practitioners in the semiconductor arts will appreciate that the layout shown in FIG. 5 reduces pitch in the X direction, thereby increasing the total channel width in a given area, thus reducing channel resistance and hence $R_{on}$, as compared to the embodiments shown in FIGS. 3 & 4. In one embodiment with a channel length of about 1 µm, a JFET width of 1.4 µm, a 200 µm substrate thickness, and a 5 µm pitch(x), specific on-resistance was measured at 3.65 milliohms×cm$^2$, which is 12.5% lower than a conventional SiC MOSFET without serpentine or wavy regions. It is understood that improvement in the channel resistance may come at the expense of a slightly increased source resistance due to reduced source contact area, but $R_{on}$ is improved overall.

Persons of skill in the semiconductor arts will understand that in other embodiments there need not be a P+ body region contact 54 in each gate polysilicon opening 56.

The above description of illustrated example embodiments, including what is described in the Abstract, are not intended to be exhaustive or to be limitation to the precise forms or structures disclosed. While specific embodiments and examples of the subject matter described herein are for illustrative purposes, various equivalent modifications are possible without departing from the broader spirit and scope of the present invention. Indeed, it is appreciated that the specific example thicknesses, material types, concentrations, voltages, etc., are provided for explanation purposes and that other values may also be employed in other embodiments and examples in accordance with the teachings of the present invention.

We claim:

1. A metal-oxide semiconductor transistor (MOSFET) comprising:
   a silicon carbide (SiC) substrate having top and bottom planar surfaces;
   a drain region of a first conductivity type disposed at the bottom planar surface;
   an extended drain region of the first conductivity type disposed above the drain region;
   a junction field-effect transistor (JFET) region that extends up to the top planar surface;
   first and second well regions of a second conductivity type that respectively adjoin opposite lateral sides of the JFET region;
   first and second source regions of the first conductivity type respectively disposed in the first and second well regions, each of the first and second source regions extending up to the top planar surface, first and second channel regions of the respective first and second well regions laterally separating the first and second source regions from the JFET region by a channel length, the first and second channel regions extending up to the top planar surface;
   first and second body regions of the second conductivity type that adjoin the first and second source regions a distance away from the first and second channel regions, respectively, the first and second body regions extending up to the top planar surface;
   a gate member disposed above the top planar surface, the gate member being insulated from the top planar surface by a thin dielectric layer, the gate member extending laterally over the JFET region and the first and second channel regions;
   a top metal layer that electrically contacts the first and second source regions, and a bottom metal layer that electrically contacts the drain region;
   when the MOSFET is in an on-state with a high voltage applied to the gate member relative to the first and second source regions, a conduction channel is formed below the top planar surface in the first and second channel regions such that a current flows laterally from the first and second source regions to the JFET region, and then in a vertical direction down the extended drain region to the drain region;
   wherein the first and second channel regions are each arranged in a wave-shaped pattern at the top planar surface, the wave-shaped pattern extending in first and second lateral directions.

2. The MOSFET of claim 1 wherein the wave-shaped pattern comprise semi-circular regions that extend in the first and second lateral directions, with the semi-circular regions alternating orientation by 180 degrees along the second direction.

3. The MOSFET of claim 1 wherein the channel length, as measured at any tangential point along the wave-shaped pattern of the first and second channel regions is a constant length.

4. The MOSFET of claim 3 wherein the constant length is in a range of about 0.6 to 1.0 µm.

5. The MOSFET of claim 1 wherein the wave-shaped pattern of the first channel region is in-phase with the wave-shaped pattern of the second channel region.

6. The MOSFET of claim 1 wherein the first and second body regions have a circular shape at the top planar surface.

7. The MOSFET of claim 6 wherein the first and second body regions each are disposed in a pocket area under a cresting portion of the wave-shaped pattern.

8. The MOSFET of claim 7 wherein the first and second body regions are disposed at different positions in the second lateral direction.

9. The MOSFET of claim 1 further comprising third and fourth body regions of the second conductivity type that adjoin the first and second source regions a distance away from the first and second channel regions, respectively, the third and fourth body regions extending up to the top planar surface.

10. The MOSFET of claim 1 further comprising a current spreading layer (CSL) of the first conductivity type disposed between the JFET region and the extended drain region, the CSL extending laterally beneath the first and second well regions.

11. A metal-oxide semiconductor transistor (MOSFET) comprising:
    a silicon carbide (SiC) substrate having top and bottom planar surfaces;
    a drain region of a first conductivity type disposed at the bottom planar surface;
    an extended drain region of a first conductivity type disposed above the drain region;
    a plurality of well regions of a second conductivity type disposed above the extended drain region;
    a plurality of junction field-effect transistor (JFET) regions each of which laterally separates an adjacent pair of well regions, the JFET regions extending up to the top planar surface;
    a plurality of source regions of the first conductivity type correspondingly disposed in the plurality of well regions, each of the source regions extending up to the top planar surface, a channel region of each of the plurality of well regions laterally adjoining one of the plurality of the JFET regions, the channel region extending up to the top planar surface and laterally separating each source region from an adjacent JFET region by a channel length;

a plurality of body regions of the second conductivity type each of which adjoin a source region, each body region extending up to the top planar surface;

one or more gate members disposed above the top planar surface, the gate member being insulated from the top planar surface by a thin dielectric layer, the one or more gate members extending laterally over each JFET region and each channel region;

a top metal layer that electrically contacts the source regions, and a bottom metal layer that electrically contacts the drain region;

when the MOSFET is in an on-state with a high voltage applied to the one or more gate members relative to the source, a conduction channel is formed below the top planar surface in each channel region such that a current flows laterally from the source regions to the JFET regions, and then in a vertical direction down through the extended drain region to the drain region;

wherein the JFET regions are each arranged in a serpentine-shaped pattern at the top planar surface, the serpentine-shaped pattern extending in first and second lateral directions, the serpentine pattern including straight sections that extend in a first lateral direction, the straight sections being connected by curved sections that alternately shift the straight sections a predetermined distance in the second lateral direction.

12. The MOSFET of claim 11 further comprising a current spreading layer (CSL) of the first conductivity type disposed between each JFET region and the extended drain region, the CSL extending laterally beneath each well region.

13. The MOSFET of claim 11 wherein the straight sections of adjacent JFET regions are alternately separated in the second lateral direction by first and second distances, the first distance being wider than the second distance.

14. The MOSFET of claim 13 wherein the one or more gate members comprise a single gate member that extends laterally in the first and second directions over the MOSFET in all areas except for a plurality of openings within which the body regions are disposed.

15. The MOSFET of claim 14 wherein the openings are each disposed in an area where the straight sections of adjacent JFET regions are separated by the first distance.

16. The MOSFET of claim 15 wherein the openings are racetrack-shaped.

17. The MOSFET of claim 11 wherein each channel region has a serpentine-shaped pattern in the first and second directions that follows the serpentine-shaped pattern of an adjoining JFET region.

18. The MOSFET of claim 11 wherein the channel length of each channel region is a constant length, as measured at any tangential point along the serpentine-shaped pattern of each channel region.

19. The MOSFET of claim 18 wherein the constant length is about 1 μm.

20. The MOSFET of claim 11 wherein the body regions have a rectilinear shape that extends in the first and second directions at the top planar surface.

* * * * *